(12) United States Patent
Nakata et al.

(10) Patent No.: US 10,430,090 B2
(45) Date of Patent: *Oct. 1, 2019

(54) METHOD OF CONTROLLING MEMORY SYSTEM AND METHOD OF CONTROLLING INFORMATION-PROCESSING DEVICE

(71) Applicant: TOSHIBA MEMORY CORPORATION, Minato-ku (JP)

(72) Inventors: Daisuke Nakata, Chigasaki (JP); Yu Muraki, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/259,184

(22) Filed: Jan. 28, 2019

(65) Prior Publication Data

US 2019/0155526 A1 May 23, 2019

Related U.S. Application Data

(63) Continuation of application No. 15/254,329, filed on Sep. 1, 2016, now Pat. No. 10,228,872.

(Continued)

(51) Int. Cl.
*G06F 3/06* (2006.01)
*G06F 1/3296* (2019.01)
(Continued)

(52) U.S. Cl.
CPC .......... *G06F 3/0619* (2013.01); *G06F 1/3296* (2013.01); *G06F 3/0634* (2013.01); *G06F 3/0653* (2013.01); *G06F 3/0679* (2013.01);

*G06F 9/4418* (2013.01); *G11C 7/04* (2013.01); *G11C 11/5628* (2013.01);
(Continued)

(58) Field of Classification Search
CPC ...... G06F 3/0619; G06F 1/3296; G06F 9/442; G06F 3/0679; G06F 3/0653; G06F 3/0634; G11C 7/04; G11C 11/5635; G11C 16/0483
See application file for complete search history.

(56) References Cited

U.S. PATENT DOCUMENTS

2003/0081337 A1* 5/2003 Tanimoto ............... G11B 5/012
360/60
2008/0068873 A1* 3/2008 Matsuno ................ G11C 11/22
365/145

FOREIGN PATENT DOCUMENTS

JP 8-339693 12/1996
JP 2009-26119 2/2009
(Continued)

*Primary Examiner* — Mohammed A Bashar
(74) *Attorney, Agent, or Firm* — Oblon, McClelland, Maier & Neustadt, L.L.P.

(57) ABSTRACT

According to one embodiment, a semiconductor device includes a non-volatile memory, a temperature measurement circuit that measures a temperature of the non-volatile memory, and a controller. The controller also writes information about the temperature which is measured by the temperature measurement circuit in the non-volatile memory together when writing data in the non-volatile memory. Further, the controller performs write-back processing of writing data, which is written at a temperature in a rewriting temperature range, back when the temperature measured by the temperature measurement circuit is not in the rewriting temperature range.

20 Claims, 13 Drawing Sheets

Related U.S. Application Data

(60) Provisional application No. 62/306,338, filed on Mar. 10, 2016.

(51) Int. Cl.
*G11C 7/04* (2006.01)
*G06F 9/4401* (2018.01)
*G11C 11/56* (2006.01)
*G11C 16/10* (2006.01)
*G11C 16/32* (2006.01)
*G11C 16/34* (2006.01)
*G11C 16/04* (2006.01)

(52) U.S. Cl.
CPC ............ *G11C 16/10* (2013.01); *G11C 16/102* (2013.01); *G11C 16/105* (2013.01); *G11C 16/32* (2013.01); *G11C 16/3418* (2013.01); *G11C 16/0483* (2013.01); *G11C 2211/5641* (2013.01)

(56) References Cited

FOREIGN PATENT DOCUMENTS

| JP | 4701807 | 6/2011 |
| JP | 2011-243132 | 12/2011 |

* cited by examiner

WITHOUT WRITE-BACK PROCESSING

DATA TEMPERATURE: LT  HT  RT

AFTER WRITE-BACK PROCESSING

DATA TEMPERATURE: LT  HT  RT

| TEMPERATURE OF MEMORY CHIP OBTAINED AT TIME OF WRITING OF DATA | NAND PARAMETER | |
| --- | --- | --- |
| | Vp | Wp |
| Ta | V1 | W1 |
| Tb | V2 | W2 |
| Tc | V3 | W3 |
| ⋮ | ⋮ | ⋮ |

METHOD OF CONTROLLING MEMORY
SYSTEM AND METHOD OF CONTROLLING
INFORMATION-PROCESSING DEVICE

CROSS-REFERENCE TO RELATED
APPLICATIONS

This application is a continuation of U.S. Ser. No. 15/254,329, filed Sep. 1, 2016 which claims the benefit of priority from U.S. Provisional Application No. 62/306,338, filed on Mar. 10, 2016; the entire contents of each of which are incorporated herein by reference.

FIELD

Embodiments described herein relate generally to a semiconductor device, and an information-processing device.

BACKGROUND

When a memory device using a NAND flash memory (hereinafter, referred to as a NAND memory) performs the readout of data is performed at a temperature different from temperature that is obtained at the time of the writing of data, cross temperature in which a variation in a threshold voltage is increased is generated. As a difference between temperature obtained at the time of the writing of data and temperature obtained at the time of the readout of data is increased, the change of the distribution of the threshold voltage is increased. For this reason, there is a case in which data cannot be accurately read out. As a result, the reliability of the NAND memory deteriorates. Cross temperature in the NAND memory has not been considered in the past.

DETAILED DESCRIPTION

According to one embodiment, there is provided a semiconductor device that includes a non-volatile memory, a temperature measurement circuit, and a controller. The temperature measurement circuit measures a temperature of the non-volatile memory. The controller generates a writing or reading instruction for the non-volatile memory. The controller also writes information about the temperature which is measured by the temperature measurement circuit in the non-volatile memory together when writing data in the non-volatile memory. Further, the controller performs write-back processing of writing data, which is written at a temperature in a rewriting temperature range, back when the temperature measured by the temperature measurement circuit is not in the rewriting temperature range.

A semiconductor device and an information-processing device according to embodiments will be described in detail below with reference to accompanying drawings. Meanwhile, the invention is not limited to these embodiments.

(First Embodiment)

Figure 1:
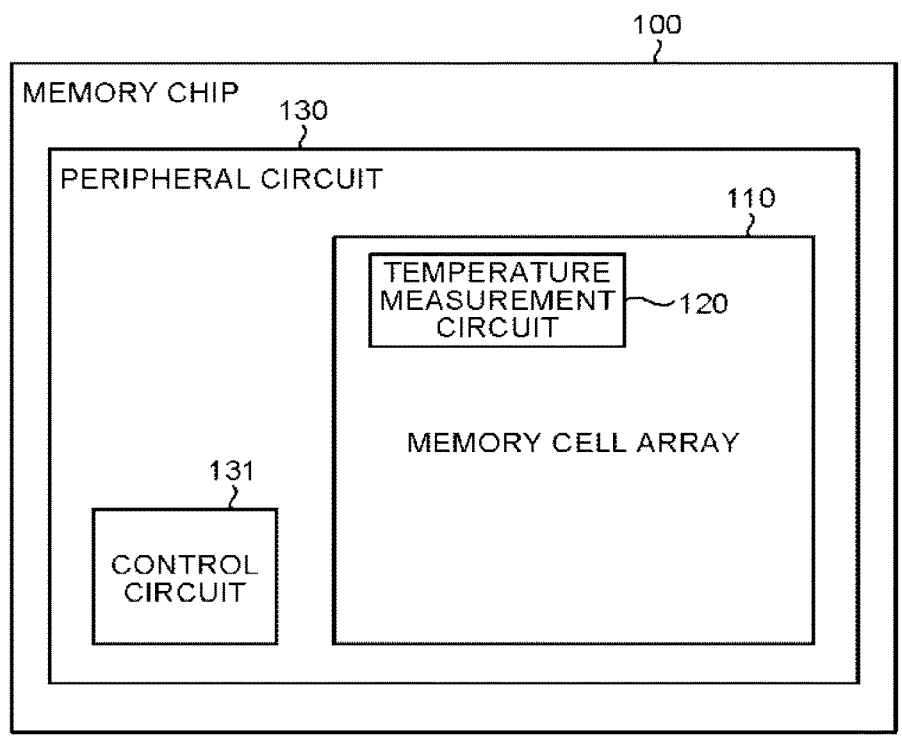
FIG. 1 is a diagram schematically illustrating an example of the structure of a memory chip according to a first embodiment.

FIG. 1 is a diagram schematically illustrating an example of the structure of a memory chip according to a first embodiment. A memory chip 100 as a semiconductor device includes a memory cell array 110, a temperature measurement circuit 120, and a peripheral circuit 130. The memory chip 100 has a structure in which a semiconductor substrate on which, for example, the memory cell array 110 and the peripheral circuit 130 are provided is sealed by a resin.

The memory cell array 110 includes a plurality of blocks each of which is the minimum unit of data erasure. A plurality of memory cells are arranged in the shape of a matrix in each block. Further, each block includes a plurality of pages each of which is the minimum unit of data access, that is, the readout and writing of data. Each memory cell may be adapted to store one bit, or may be adapted to store two bits or more.

Meanwhile, the memory cell is formed of a non-volatile semiconductor memory device of a floating gate type or a non-volatile semiconductor memory device of a charge trap type. Further, the memory cell array 110 may have a two-dimensional structure in which memory cells are two-dimensionally disposed, or may have a three-dimensional structure in which memory cells are three-dimensionally disposed.

The memory cell array 110 having a two-dimensional structure includes a plurality of memory strings. The memory string has a structure in which memory cells are connected in series. Furthermore, the plurality of memory strings are connected to each other by wiring (word lines) that extends in a direction crossing the extending direction of the string.

The memory cell array 110 having a three-dimensional structure has a structure in which a plurality of memory strings are two-dimensionally disposed on a semiconductor substrate. Channels of the memory strings are disposed perpendicular to the surface of the substrate, and a plurality of memory cells of the memory strings are stacked in a height direction. The memory cells, which are present at the same height in a certain range, are connected to each other by wiring (word lines).

The temperature measurement circuit 120 measures the temperature of the memory chip 100. It is preferable that the temperature measurement circuit 120 is provided at a position where the temperature measurement circuit 120 can measure the temperature of the memory cell array 110. The temperature measurement circuit 120 may be a temperature sensor provided on the outer surface of the memory chip 100 sealed with a resin, or may be a temperature measurement circuit provided in the memory cell array 110.

The peripheral circuit 130 is disposed around the memory cell array 110 provided on the semiconductor substrate, and includes a circuit that drives the memory cell array 110. For example, a row decoder that applies a voltage to each block of the memory cell array 110, a sense amplifier that detects a current, a logic circuit that processes an external signal, and the like, can be exemplified as the peripheral circuit.

Further, the peripheral circuit 130 includes a control circuit 131 that generates a writing or reading command for the memory cell array 110. When writing data in the memory cell array 110, the control circuit 131 adds information about the temperature, which is acquired from the temperature measurement circuit 120, to the data and writes the data.

Figure 2:
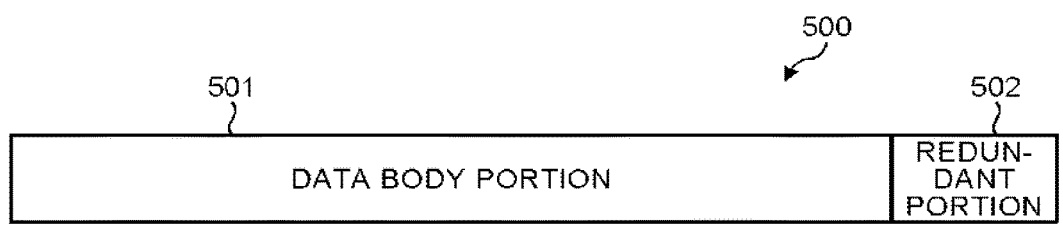
FIG. 2 is a diagram schematically illustrating an example of the structure of data written in a memory cell array.

FIG. 2 is a diagram schematically illustrating an example of the structure of data written in the memory cell array. Data 500 generally includes a data body portion 501 and a redundant portion 502. For example, the data 500 is data that has the size of a page unit. Ordinary data, such as user data and address management information, are stored in the data body portion 501. The user data is data that is instructed to be stored from the outside (for example, a host device), and document data, image data, video data, music data, and the like can be exemplified as the user data. The address management information is information in which logical block addresses, which are used when a host device has access to the memory chip 100, are associated with physical addresses present in the memory cell array 110 (block addresses+page addresses+storage positions in the page).

Management information, such as the number of times of writing/erasure of data in the data body portion 501 and elapsed time after the writing of data, is stored in the redundant portion 502. In this embodiment, the management information includes information about the temperature of the memory chip obtained at the time of the writing of data. That is, the temperature of the memory chip obtained at the time of the writing of data is stored in the redundant portion 502.

Further, when temperature measured by the temperature measurement circuit 120 is in a non-rewriting temperature range in a case in which data written at a temperature in a rewriting temperature range is present in the memory cell array 110, the control circuit 131 reads out the data written at the temperature in the rewriting temperature range and performs processing of writing data back in the memory cell array 110 once again (hereinafter, referred to as write-back processing). The write-back processing may be performed according to a clear instruction from the host device, or may be performed when a certain condition is satisfied in a case in which the clear instruction from the host device is not present.

The rewriting temperature range is appropriately changed according to the distribution shape of the threshold voltages of a NAND memory forming the memory cell array 110. The distribution of the threshold voltages of memory cells forming the NAND memory is changed according to parameters of the NAND memory. For this reason, the distribution of the threshold voltages of the NAND memory is obtained in advance by experiments, and a rewriting temperature range, which is optimal for the distribution of the threshold voltages, is obtained.

The non-rewriting temperature range can be defined as a room temperature, for example, a range of 20° C.±15° C. The rewriting temperature range is a temperature range that is not the non-rewriting temperature range. Meanwhile, a temperature range in which the memory chip 100 can operate is defined by the junction temperature of the chip, and is in the range of, for example, −40° C. to 125° C.

For example, a case in which the control circuit 131 receives a dedicated command for instructing the write-back processing to be performed, a case in which the control circuit 131 receives a garbage collection command, a case in which the control circuit 131 receives a wear leveling command, and the like can be exemplified as the case in which the write-back processing is performed according to a clear instruction from the host device. Garbage collection is processing for moving data, which is present in all valid area of a block, in which a ratio of the valid area is equal to or lower than a certain ratio, to another block to change the block into a free block. The write-back processing can be performed during the movement of the data.

Further, wear leveling is processing for equalizing the numbers of times of rewriting of data (the numbers of times of erasure of data) in the respective blocks of the memory cell array 110. For example, the write-back processing can be performed during wear leveling for moving data to a block in which the number of times of rewriting of data is small.

Examples of the case in which the write-back processing is performed when a clear instruction from the host device is not present include a case in which an instruction is not output to the memory chip 100 from the host device and a mode is shifted to an IDLE state (low-power mode). The low-power mode is an operating mode that shifts a mode to a state in which power supplied to the memory chip 100 is shut off. For example, when the memory chip 100 does not receive an instruction (command) from the host device for a certain time, a mode is shifted to a low-power mode (the supply of power to the memory chip 100 is shut off). There is a time until a mode is shifted to a low-power mode after it is determined that the memory chip 100 does not receive an instruction for a certain time. The write-back processing is performed using this time. That is, when it is determined that a mode is shifted to a low-power mode, there is substantially no command from the host device and the semiconductor device enters a low-power mode after the write-back processing is performed in the background.

Next, an operation in the memory chip 100 according to this embodiment will be described. The processing of writing data in the memory chip 100 and the processing of writing data back will be described below in this order.

<Processing of Writing Data in the Memory Chip>

Figure 3:
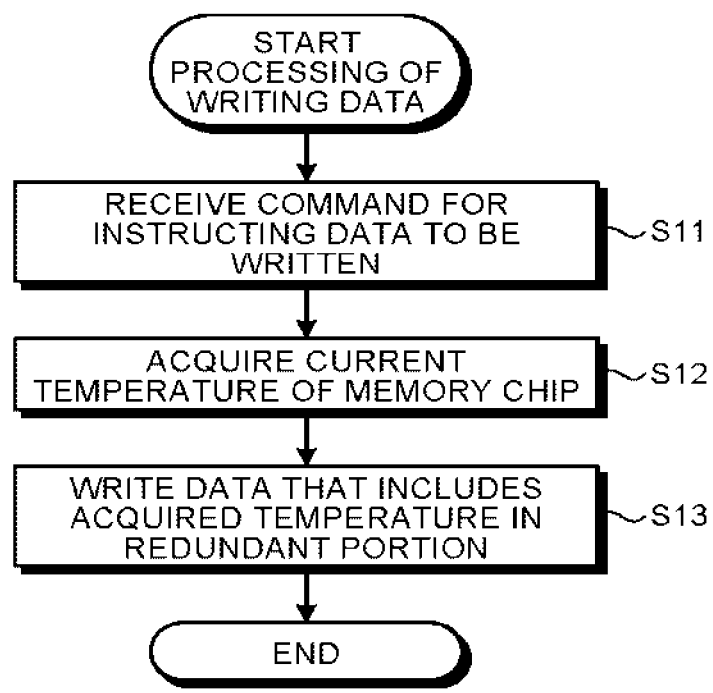
FIG. 3 is a flowchart illustrating an example of a procedure of processing for writing data in the memory chip according to the first embodiment.

FIG. 3 is a flowchart illustrating an example of a procedure of the processing of writing data in the memory chip according to the first embodiment. First, when the control circuit 131 receives a command for instructing data to be written from the outside of the memory chip 100, for example, a host device (Step S11), the control circuit 131 acquires the current temperature of the memory chip 100 that is measured by the temperature measurement circuit 120 (Step S12). After that, the control circuit 131 writes the data 500, which includes the data body portion 501 and the redundant portion 502 including the temperature acquired in Step S12, in the memory cell array 110 (Step S13). The processing of writing data ends in this way.

<Processing of Writing Data Back>

Figure 4:
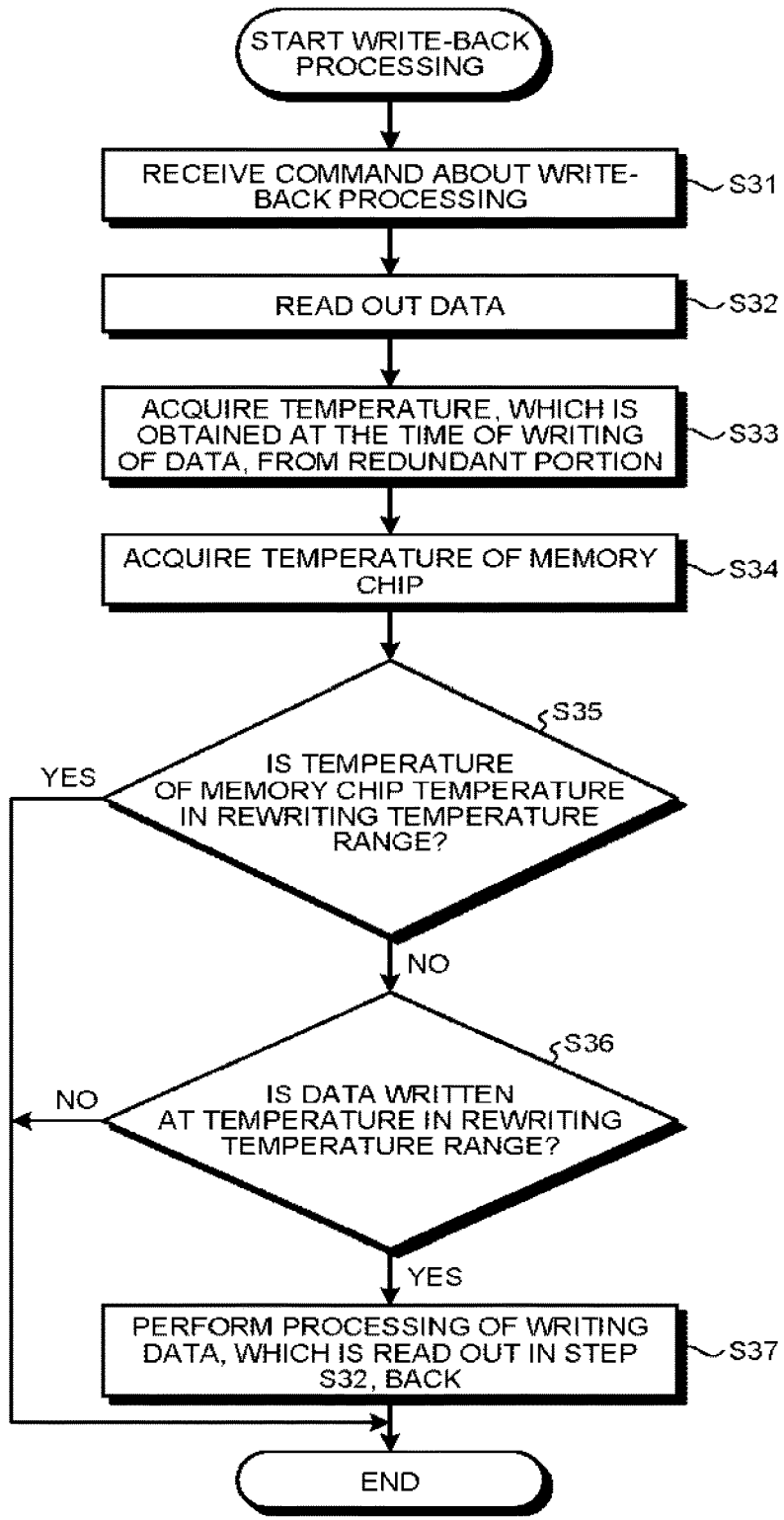
FIG. 4 is a flowchart illustrating an example of a procedure of processing for writing data back according to the first embodiment.

FIG. 4 is a flowchart illustrating an example of a procedure of the processing of writing data back according to the first embodiment. First, the control circuit 131 receives a command about the write-back processing (Step S31). This command may be a dedicated command for instructing the write-back processing to be performed or may be another command, such as wear leveling or garbage collection, as described above. Meanwhile, this command may be an instruction that is output when a period in which a command is not received from the host device is continued for a certain time and the semiconductor device enters a low-power mode.

When receiving a command about the write-back processing, the control circuit 131 performs the readout of the data (Step S32) and acquires the temperature, which is obtained at the time of writing of data, from the redundant portion 502 (Step S33). Meanwhile, a position where the control circuit performs the readout of the data is arbitrary. For example, the position where the control circuit reads out the data may be a position next to a position where the control circuit reads out the data when the control circuit receives a command about the previous write-back processing. Further, the readout of the data can be performed by, for example, the page unit.

Then, the control circuit 131 acquires the temperature of the memory chip 100 from the temperature measurement circuit 120 (Step S34). After that, the control circuit 131 determines whether or not the temperature of the memory chip is a temperature in the rewriting temperature range (Step S35). If the temperature of the memory chip is a temperature in the rewriting temperature range (Yes in Step S35), the control circuit 131 does not perform the write-back processing and processing ends.

On the other hand, if the temperature of the memory chip is not a temperature in the rewriting temperature range (No in Step S35), the control circuit 131 determines whether or not the data is data written at a temperature in the rewriting temperature range (Step S36).

If the data is data written at a temperature in the rewriting temperature range (Yes in Step S36), the control circuit 131 performs processing of writing the data, which is read out in Step S32, back (Step S37). In this write-back processing, the data 500 including the data body portion 501, which has been read out, may be written back at the same physical position in the memory cell array 110, and the data 500 including the data body portion 501, which has been read out, may be written back at another physical position in the memory cell array 110. Since a physical address corresponding to a logical address is changed in the latter case, address conversion information is changed. The write-back processing ends in this way.

Further, if the data is not data written at a temperature in the rewriting temperature range, that is, if temperature, which is read out, is in the non-rewriting temperature range (No in Step S36), corresponding data body portion 501 does not need to be written back. Accordingly, the control circuit 131 does not perform any processing and processing ends.

Meanwhile, the above-mentioned processing of Steps S31 to S37 may be performed for a plurality of data written in the memory cell array 110.

Figure 5:
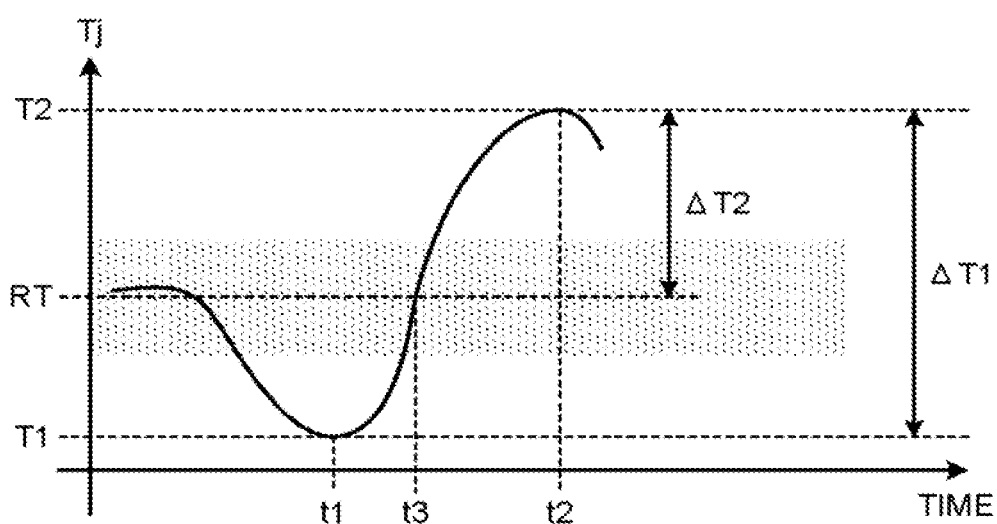
FIG. 5 is a diagram illustrating factors that cause the cross temperature of the memory cell array.

FIG. 5 is a diagram illustrating factors that cause the cross temperature of the memory cell array. In FIG. 5, a horizontal axis represents elapsed time and a vertical axis represents junction temperature (Tj). Further, FIGS. 6A and 6B are diagrams schematically illustrating an example of the aspect of the temperature of the memory cell array during the writing of data, FIG. 6A is a diagram illustrating an example of the aspect of the temperature of the memory cell array in a case in which write-back processing is not performed, and FIG. 6B is a diagram illustrating an example of the aspect of the temperature of the memory cell array after the write-back processing according to the first embodiment is performed.

As illustrated in FIG. 5, the writing of data is performed at time t1. The temperature of the memory cell array 110 at this time is temperature T1 lower than a room temperature (RT). The temperature T1 is in the rewriting temperature range. After that, the readout of the same data is performed at time t2. The temperature of the memory cell array 110 at this time is temperature T2 higher than the room temperature. The temperature T2 is in the rewriting temperature range. There is a case in which data is not successfully read at the time of the readout of the data in a situation in which the data is written at low temperature and is read out at high temperature as described above. As the value of cross temperature $\Delta T1$ $(=T2-T1)$, which is a difference between the temperature of the memory cell array obtained at the time of the writing of data and the temperature of the memory cell array obtained at the time of the readout of data, is increased, a probability that the data is not successfully read is increased. Likewise, there is a case in which data is not successfully read at the time of the readout of the data even when data is written at high temperature and is read out at low temperature on the contrary to this.

Figure 6A:
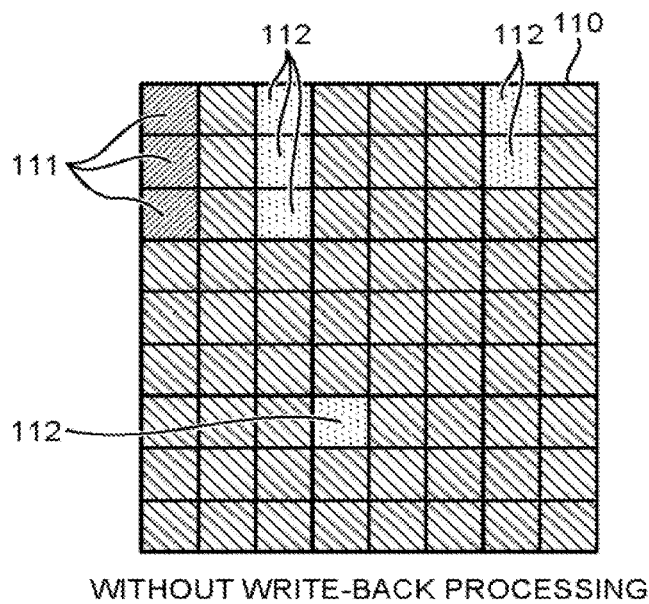
FIGS. 6A and 6B are diagrams schematically illustrating an example of the aspect of the temperature of the memory cell array during the writing of data.
Figure 6B:
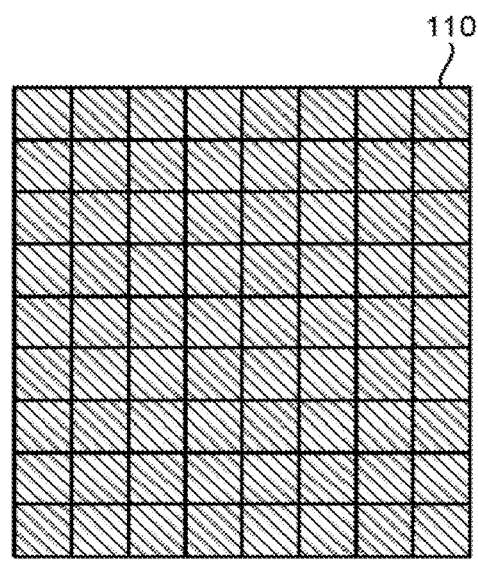

In a comparative example in which the write-back processing is not performed, a variation in the temperature of the memory cell array 110 obtained at the time of the writing of data is present according to a position in the memory cell array 110 as illustrated in FIG. 6A. For this reason, the degree of generation of an error is changed according to the temperature of the memory cell array 110 at the time of the readout of data. There are many cases in which data cannot be successfully read out, for example, when data 111, which is written at a temperature LT lower than the room temperature (non-rewriting temperature range), is read out at a temperature higher than the room temperature. Further, there are many cases in which data cannot be successfully read out even when data 112, which is written at a temperature HT higher than the room temperature, is read out at a temperature lower than the room temperature.

On the other hand, in this embodiment, the write-back processing is performed on data, which is written in the rewriting temperature range, at time t3 where the temperature of the memory cell array 110 is in the non-rewriting temperature range, that is, a temperature range corresponding to the room temperature RT, after the time t1. That is, data 111 and 112, which are written at a temperature in the rewriting temperature range, are read out from the memory cell array 110 and are written in the memory cell array 110 again. Accordingly, as illustrated in FIG. 6B, the data 111 and 112, which are written at the temperature in the rewriting temperature range, are not present in the memory cell array 110 and only data, which are written at a temperature in the non-rewriting temperature range, are present in the memory cell array 110.

After that, the same data are read out at the time t2. At this time, cross temperature ΔT2 (=T2−RT), which is a difference between the temperature of the memory cell array obtained at the time of the writing of data and the temperature of the memory cell array obtained at the time of the readout of data, is about a half of the cross temperature ΔT1 of the case of the comparative example. For this reason, a probability that the data is not successfully read can be reduced in comparison with the case of the comparative example.

In the first embodiment, information, which includes information about temperature at the time of the writing of data, is written in the memory cell array 110. Further, when the temperature of written data is in the rewriting temperature range and the temperature of the memory cell array 110 is in the non-rewriting temperature range (room temperature), the control circuit reads out the data and performs the write-back processing of writing data again. Accordingly, it is possible to reduce the cross temperature, which is a difference between the temperature of the memory cell array obtained at the time of the readout of data, and the temperature of the memory cell array obtained at the time of the writing of data in comparison with a case in which the write-back processing is not performed, and to reduce a probability that data is disguised in comparison with a case in which the write-back processing is not performed.

(Second Embodiment)

The memory chip has been described in the first embodiment. A memory chip is generally provided as a memory device that is combined with a controller chip. A memory device, which has a function to perform processing of writing data back, will be described in a second embodiment.

Figure 7:
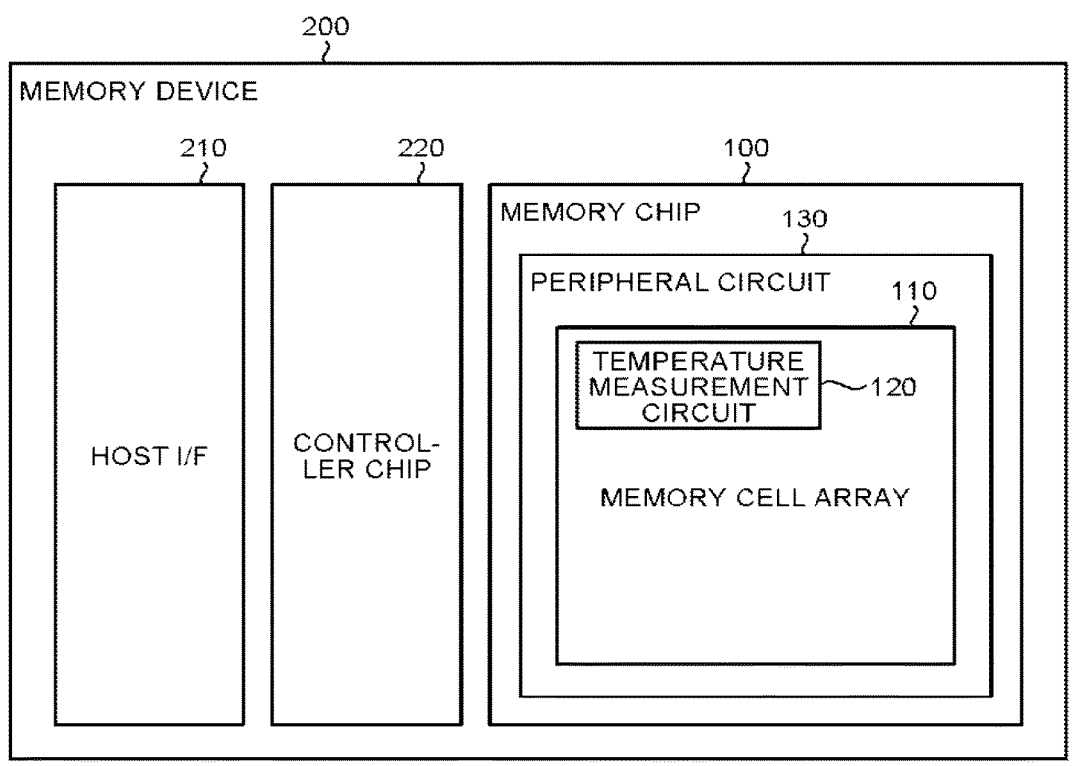
FIG. 7 is a diagram schematically illustrating an example of the structure of a memory device according to a second embodiment.

FIG. 7 is a diagram schematically illustrating an example of the structure of the memory device according to the second embodiment. A memory device 200 as a semiconductor device includes a host I/F 210, a memory chip 100, and a controller chip 220. The memory device 200 has a structure in which, for example, the memory chip 100 and the controller chip 220 are stacked and molded by a resin. Meanwhile, one memory chip 100 may be provided or two or more memory chips 100 may be provided.

The host I/F 210 is connected to a host device (not illustrated) by a communication line, and controls the communication (transmission processing or the like) between the host device and the memory device 200 according to the type or standard of the communication line.

The memory chip 100 includes a memory cell array 110, a temperature measurement circuit 120, and a peripheral circuit 130. The structure of the memory chip 100 is the same as that described in FIG. 1. However, the peripheral circuit 130 has included the control circuit 131 in FIG. 1, but does not include the control circuit 131 in FIG. 7. That is, the peripheral circuit 130 does not have a function to determine whether or not write-back processing is needed and to voluntarily perform the write-back processing. The peripheral circuit 130 performs the writing of data in the memory cell array 110 or the readout of data from the memory cell array 110 according to a writing or reading instruction from the controller chip 220.

The controller chip 220 is a semiconductor chip that controls the operation of the memory chip 100, and functions as a controller for the memory device 200. The controller chip 220 interprets a command received from the host device through the host I/F 210, and controls the writing of data in the memory cell array 110 of the memory chip 100 or the readout of data from the memory cell array 110 according to this command. Further, the controller chip 220 includes a control circuit that performs processing of writing data, which is written at a temperature in a rewriting temperature range, back when the temperature measured by the temperature measurement circuit 120 is in a non-rewriting temperature range in a case in which the data written at a temperature in the rewriting temperature range is present in the memory cell array 110.

That is, a function, which has been mounted on the memory chip 100 in FIG. 1, determines whether or not the write-back processing is needed, and performs a reading instruction and a writing instruction for allowing the write-back processing to be performed, is mounted on the controller chip 220 in FIG. 7. Since the write-back processing performed in the memory device 200 is the same as the above-mentioned write-back processing, the description thereof will be omitted.

An eMMC (embedded Multi Media Card), an eUFS (embedded Universal Flash Storage), and the like can be exemplified as the memory device 200.

Further, since processing for writing data and processing of writing data back, which are performed in the memory device 200, are the same as those described in the first embodiment, the description thereof will be omitted.

The same effects as the effects of the first embodiment can be obtained even in the second embodiment.

(Third Embodiment)

A memory device is connected to a host device and is provided as an information-processing device. An information-processing device having a function to perform processing of writing data back will be described in a third embodiment.

Figure 8:
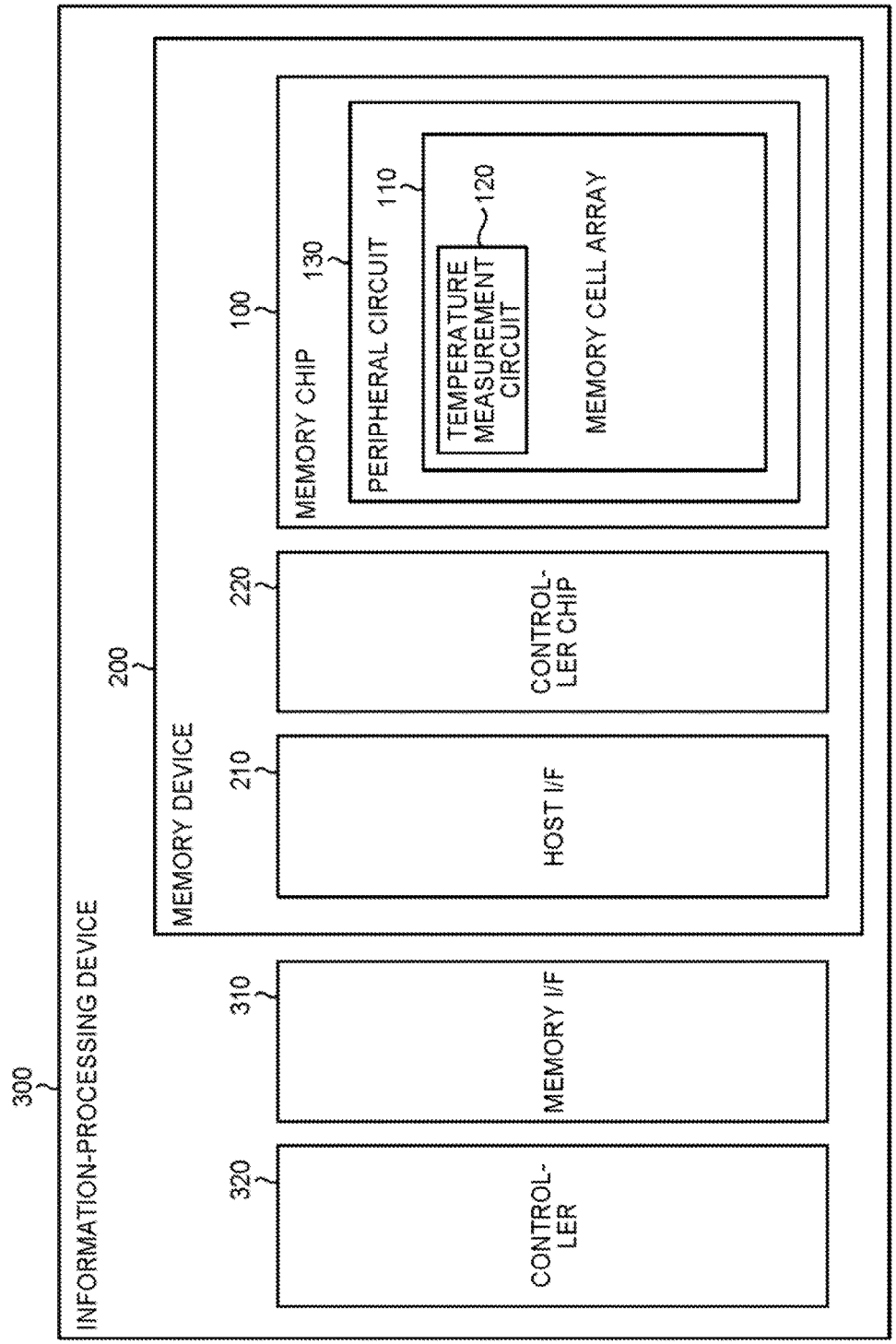
FIG. 8 is a diagram schematically illustrating an example of the structure of an information-processing device according to a third embodiment.

FIG. 8 is a diagram schematically illustrating an example of the structure of the information-processing device according to the third embodiment. An information-processing device 300 includes a memory device 200, a memory I/F 310, and a controller 320. The memory device 200 includes a host I/F 210, a memory chip 100, and a controller chip 220. The memory device 200 has the same structure as the memory device illustrated in FIG. 7, but the controller chip 220 does not have a function to determine whether or not write-back processing is needed and to voluntarily perform the write-back processing.

The memory I/F 310 is connected to the memory device 200 by a communication line, and controls the communication (transmission processing or the like) between the information-processing device 300 (host device) and the memory device 200 according to the type or standard of the communication line.

The controller 320 controls the operation of the entire information-processing device 300. The controller 320 performs, for example, a command for instructing data to be written in the memory device 200, a command for instructing data to be read out from the memory device 200, or the like. Further, the controller 320 performs the management of the power of the memory device 200, the management of the quality of the memory device 200, and the like. For example, an instruction, which allows a mode to be shifted to a low-power mode, or the like, can be exemplified as the management of power. For example, a command, such as wear leveling or garbage collection, can be exemplified as the management of quality. Furthermore, the controller 320 performs processing of writing data, which is written at a temperature in the rewriting temperature range, back when temperature measured by the temperature measurement circuit 120 is in a non-rewriting temperature range in a case in which the data written at a temperature in the rewriting temperature range is present in the memory cell array 110. The memory I/F 310 and the controller 320 are connected to each other through a bus.

That is, a function, which has been mounted on the memory chip 100 in FIG. 1, determines whether or not the write-back processing is needed, and performs a reading instruction and a writing instruction for allowing the write-back processing to be performed, is mounted on the controller 320 of the information-processing device 300 in FIG. 8. Since the write-back processing performed in the information-processing device 300 is the same as the above-mentioned write-back processing, the description thereof will be omitted.

As described above, the memory device 200 is built in the information-processing device 300 and the information-processing device 300 functions as a host device of the memory device 200. The information-processing device 300 is used as, for example, a personal computer, a mobile phone, a smartphone, a tablet terminal, an imaging device, a game machine, or the like.

Figure 9:
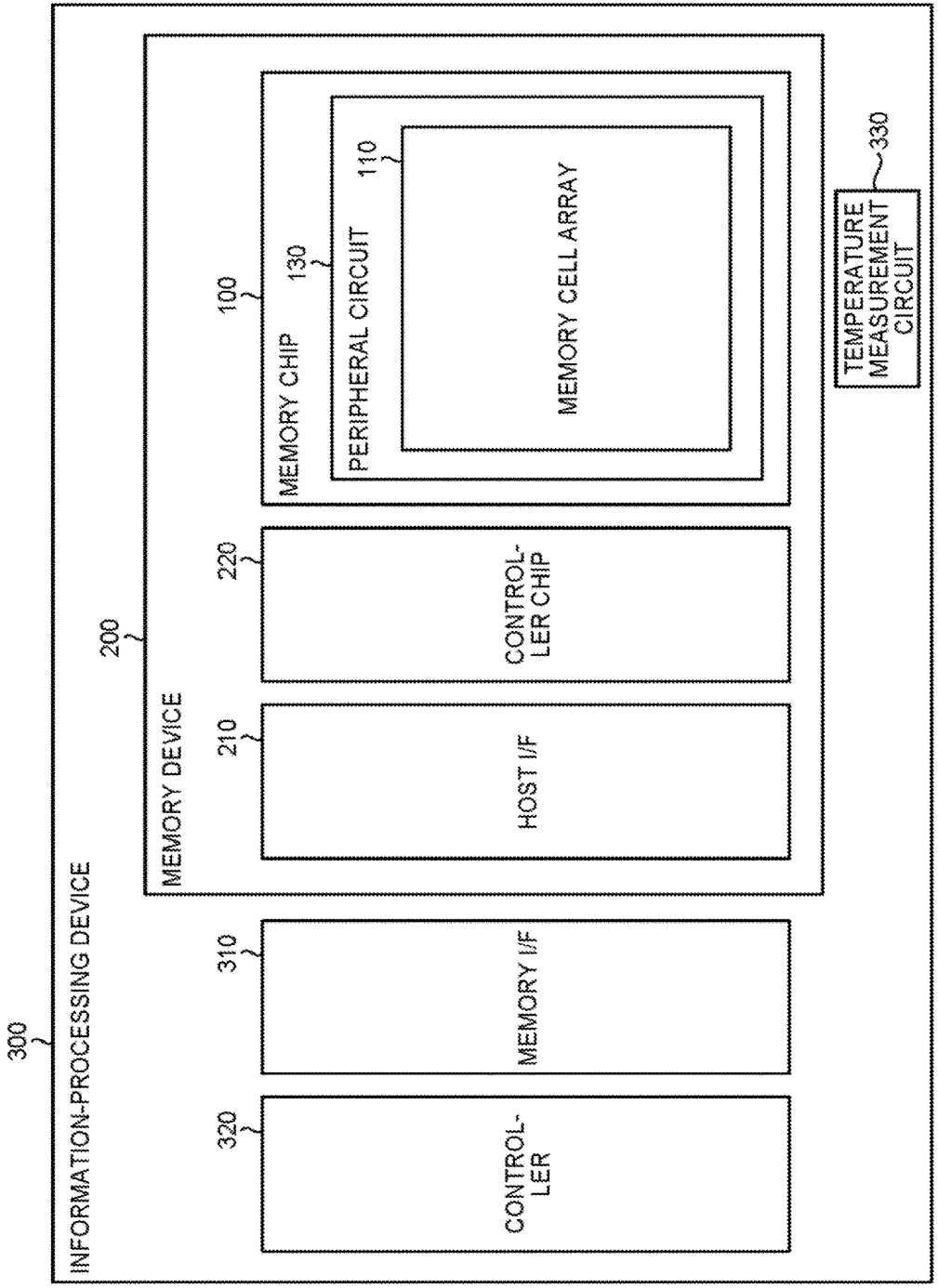
FIG. 9 is a diagram schematically illustrating another example of the structure of the information-processing device according to the third embodiment.

Meanwhile, FIG. 8 illustrates the structure of the information-processing device 300 in a case in which the memory chip 100 includes the temperature measurement circuit 120. However, there is also a case in which the information-processing device 300 includes a temperature measurement circuit. FIG. 9 is a diagram schematically illustrating another example of the structure of the information-processing device according to the third embodiment. The information-processing device 300 includes a memory device 200, a memory I/F 310, a controller 320, and a temperature measurement circuit 330.

The memory device 200 includes a host I/F 210, a memory chip 100, and a controller chip 220. The host I/F 210 and the controller chip 220 have the same structure as the structure described in FIG. 8. The memory chip 100 includes a memory cell array 110 and a peripheral circuit 130. That is, the memory chip 100 does not include the temperature measurement circuit 120 and the control circuit 131 unlike the case of FIG. 1.

The temperature measurement circuit 330 measures the temperature of the information-processing device 300. Meanwhile, the temperature measurement circuit 330 is provided at a position close to the memory chip 100 of the memory device 200. The memory I/F 310 and the controller 320 are the same as those described in FIG. 8. Since the write-back processing performed in the information-processing device 300 is the same as the above-mentioned write-back processing, the description thereof will be omitted.

Meanwhile, the controller 320 includes one or more CPUs (Central Processing Units) and an RAM (Random Access Memory). When the CPU executes a program loaded in the RAM, processing, such as write-back processing, is performed.

Further, since processing of writing data and processing of writing data back, which are performed in the information-processing device 300, are the same as those described in the first embodiment, the description thereof will be omitted.

The same effects as the effects of the first embodiment can be obtained even in the third embodiment.

(Fourth Embodiment)

Cases in which the processing of writing the data, which is written at a temperature in the rewriting temperature range, back is performed at a temperature in the non-rewriting temperature range to reduce an influence of cross temperature in comparison with a case in which the write-back processing is not performed have been described in the first to third embodiments. A case in which an influence of cross temperature is reduced in comparison with the first to third embodiments will be described in a fourth embodiment.

The structure of a memory chip 100 according to the fourth embodiment is the same as that of FIG. 1 illustrating the first embodiment. However, the control circuit 131 further has a function to change a NAND parameter, which is used when data is read out, in a case in which the temperature of a memory chip 100, which is obtained at the time of the readout of data, and the temperature of the memory chip 100, which is obtained at the time of the writing of data to be read out, are compared with each other and are different from each other.

Figures 10, 11:
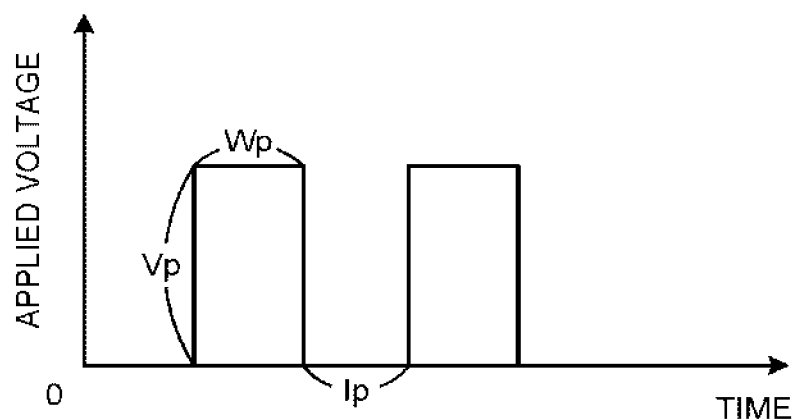
FIG. 10 is a diagram schematically illustrating an example of a NAND parameter according to a fourth embodiment.
FIG. 11 is a diagram illustrating an example of readout parameter information according to the fourth embodiment.

FIG. 10 is a diagram schematically illustrating an example of the NAND parameter according to the fourth embodiment. In this figure, a horizontal axis represents time and a vertical axis represents an applied voltage. Generally, when the readout of data is performed, a pulse voltage, which has a certain voltage value Vp, a certain pulse width Wp, and a certain interval Ip, is applied to a memory cell. When the NAND parameter, which is formed of a combination of the voltage value Vp and the pulse width Wp, is changed, characteristics in which data is read in from the memory cell is changed. That is, a NAND parameter, which is optimal when data written at a low temperature is read out, is different from a NAND parameter that is optimal when data written at a high temperature is read out.

Accordingly, readout parameter information, which represents a combination of the temperature of the memory chip, which is obtained at the time of the writing of data, and the NAND parameter, is kept in the control circuit 131 in this embodiment. Further, the control circuit 131 acquires a NAND parameter, which corresponds to the temperature of the memory chip obtained at the time of the writing of data, from the readout parameter information at the time of the readout of data, and performs the readout of data by using the acquired NAND parameter.

FIG. 11 is a diagram illustrating an example of the readout parameter information according to the fourth embodiment. The readout parameter information is the combination of the temperature of the memory chip, which is obtained at the time of the writing of data, and the NAND parameter. The NAND parameter includes the voltage value Vp and the pulse width Wp here as described above. A NAND parameter, which is suitable to read out data written at the temperature of the memory chip obtained at the time of the writing of data, is set in this way.

Figure 12A:
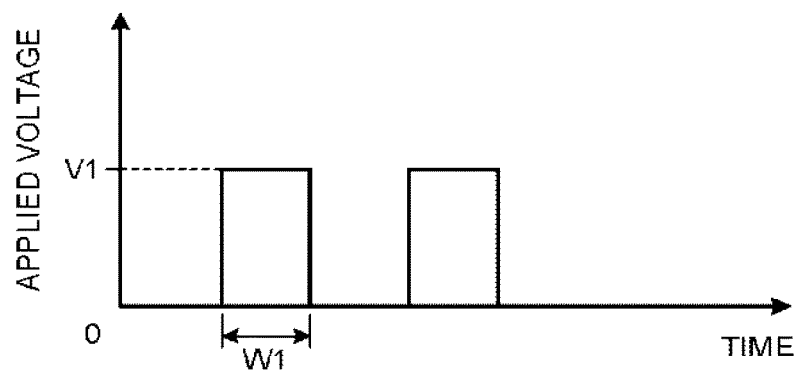
FIGS. 12A to 12C are diagrams illustrating examples of a NAND parameter that is changed according to writing temperature.
Figure 12B:
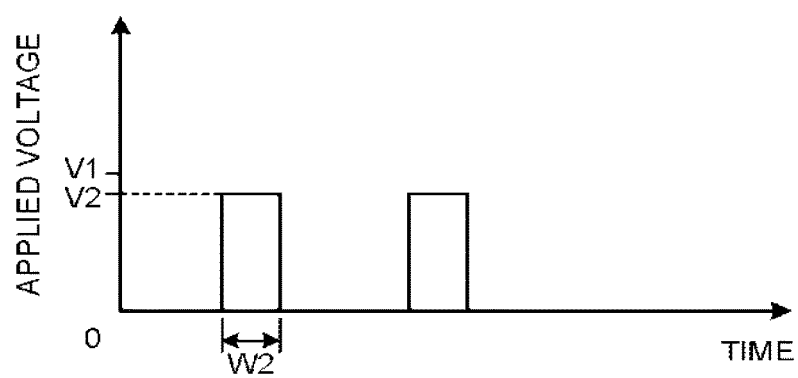
Figure 12C:
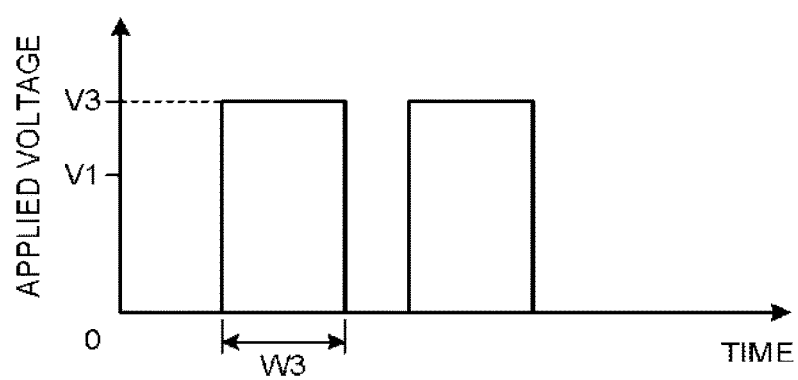

FIGS. 12A to 12C are diagrams illustrating examples of a NAND parameter that is changed according to writing temperature. A NAND parameter, of which the voltage value Vp is V1 and the pulse width Wp is W1 as illustrated in FIG. 12A, is used in the case of data written at a room temperature.

Further, a NAND parameter, of which the pulse width Wp is W2 smaller than the pulse width for the case of the room temperature and the voltage value Vp is V2 lower than the voltage value for the case of the room temperature as illustrated in FIG. 12B, is used in the case of data written at a temperature lower than the room temperature.

On the other hand, a NAND parameter, of which the pulse width Wp is W3 larger than the pulse width for the case of the room temperature and the voltage value Vp is V3 higher than the voltage value for the case of the room temperature as illustrated in FIG. 12C, is used in the case of data written at a temperature higher than the room temperature.

Meanwhile, the examples illustrated in FIGS. 12A to 12C are illustrative, and do not illustrate a general relationship between the writing temperature of a memory cell and a NAND parameter that is used in a case in which data is optimally read out from the memory cell.

Since other structures are the same as those of the first embodiment, the description thereof will be omitted.

Figure 13:
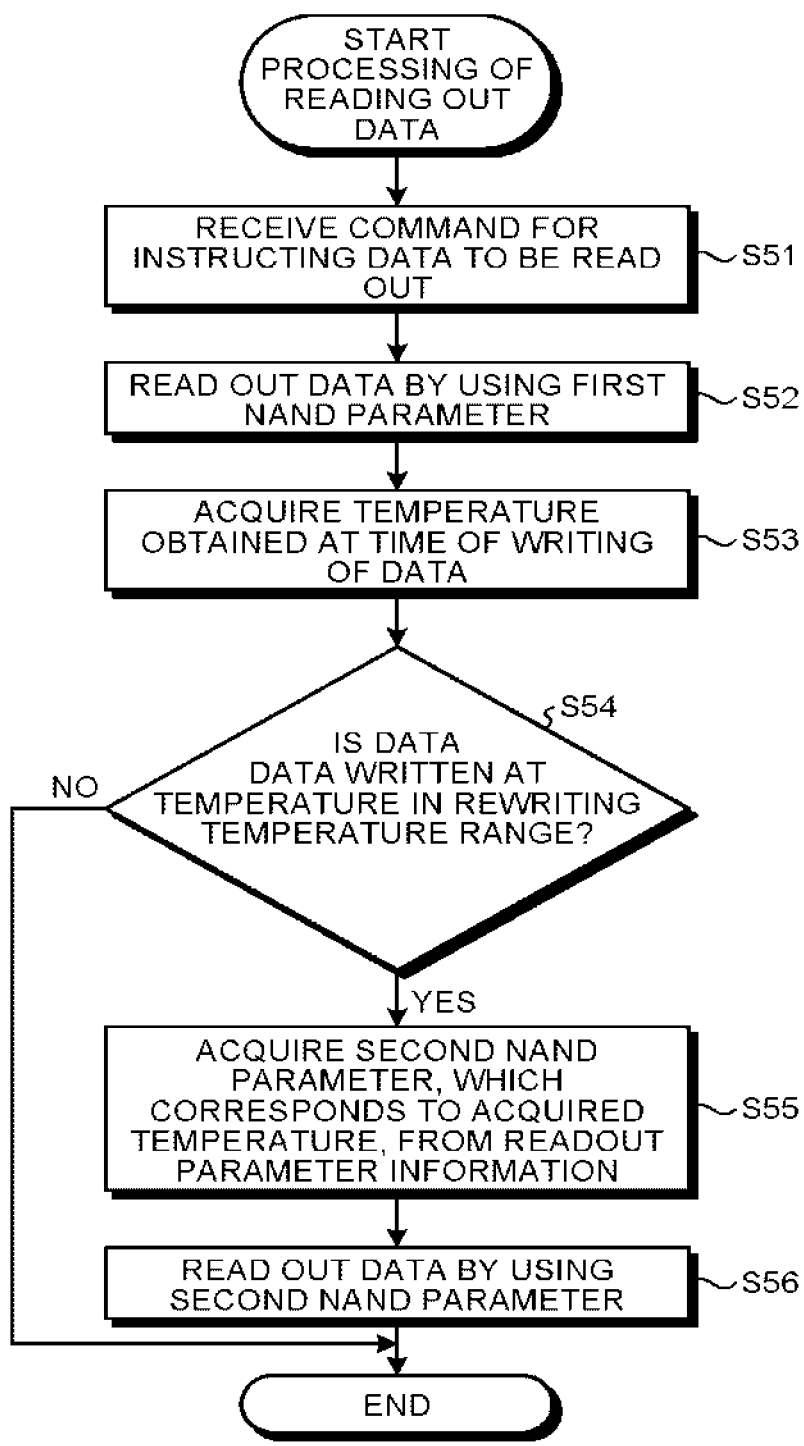
FIG. 13 is a flowchart illustrating an example of a procedure of processing for reading out data according to the fourth embodiment.

FIG. 13 is a flowchart illustrating an example of a procedure of processing of reading out data according to the fourth embodiment. First, when the control circuit 131 receives a command for instructing data to be read out (Step S51), the control circuit 131 reads out data, for which the command is received, by using a first NAND parameter (Step S52). The first NAND parameter is, for example, a NAND parameter that is used to read out data written at a room temperature.

Then, the control circuit 131 acquires temperature, which is obtained at the time of the writing of data, from the redundant portion 502 of the data that has been read out (Step S53). After that, the control circuit 131 determines whether or not the data is data written at a temperature in the rewriting temperature range (Step S54). If the data is data written at a temperature in the rewriting temperature range (Yes in Step S54), the control circuit 131 acquires a second NAND parameter, which corresponds to the acquired temperature, from the readout parameter information (Step S55). Further, the control circuit 131 performs the readout of data by using the acquired second NAND parameter (Step S56). The processing of reading out data ends in this way.

On the other hand, if the data is not data written at a temperature in the rewriting temperature range in Step S54 (No in Step S54), processing ends since the readout of data is already performed in Step S52.

For example, when data not subjected to write-back processing is read out or when the data in Step S32 of FIG. 4 is read out, the processing of reading out data is performed.

For example, a case in which the write-back processing is not performed at the time t3 and the processing of reading out data is performed at the time t2 after the processing of writing data is performed at the time t1 is considered in FIG. 5. In a case that does not depend on the fourth embodiment, the processing of reading out data is performed by using the NAND parameter that is used in the case of the room temperature of FIG. 12A. On the other hand, in a case that depends on the fourth embodiment, the NAND parameter illustrated in FIG. 12B, which is used when the temperature of the memory chip at the time of the processing of writing data is low, is used. Accordingly, a probability that data not subjected to the write-back processing can be successfully read out is increased in comparison with the case of the first embodiment.

Meanwhile, a case in which a NAND parameter is changed when data is read out has been described above, but a NAND parameter may be changed according to temperature, which is obtained at the time of the writing of data, when the data is written. Further, the memory chip 100 has been described above, but the controller chip 220 of the memory device 200 of FIG. 7 may have a function to change a NAND parameter according to writing temperature as in the second embodiment. Further, the controller 320 of the information-processing device 300 of FIGS. 8 and 9 may have a function to change a NAND parameter according to writing temperature as in the third embodiment.

In the fourth embodiment, temperature, which is obtained at the time of the writing of data, is acquired at the time of the readout of the data, the readout of the data by using a NAND parameter corresponding to the temperature is performed. Accordingly, when data written at a low temperature is read out at a high temperature or when data written at a high temperature is read out at a low temperature on the contrary to this, an influence of cross temperature can be reduced. As a result, it is possible to increase a probability that data is correctly read out.

(Fifth Embodiment)

A case in which the readout of data is performed using a NAND parameter according to writing temperature has been described in the fourth embodiment. A case in which the writing of data is performed by a method resistant to cross temperature when the temperature of the memory cell array at the time of the writing of data is in the rewriting temperature range will be described in a fifth embodiment.

The structure of the memory chip 100 according to the fifth embodiment is the same as that of FIG. 1 illustrating the first embodiment. However, the structure of the memory chip 100 is premised on the fact that the memory cell of the memory cell array 110 is an MLC (Multi Level Cell) capable of storing 2-bit data in one memory cell. The control circuit 131 generates an instruction for writing data in an SLC (Single Level Cell) mode in a case in which the temperature of the memory cell array at the time of the writing of data is in the rewriting temperature range when data is written. Further, the control circuit 131 generates an instruction for writing data in the MLC mode in a case in which the temperature of the memory cell array at the time of the writing of data is in the non-rewriting temperature range when data is written. The MLC mode is a mode in which the memory cell of an MLC is used as an MLC. The SLC mode is a mode in which the memory cell of the MLC is used as an SLC.

Figure 14A:
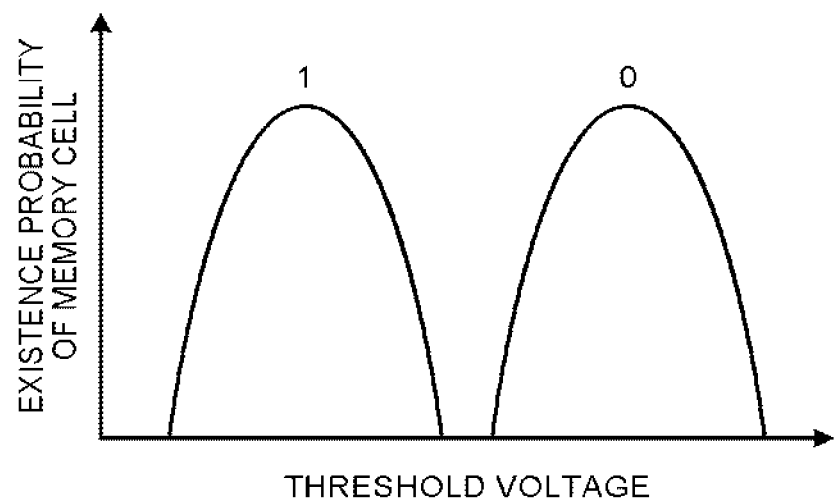
FIG. 14A is a diagram illustrating an example of the distribution shape of threshold voltages of an SLC.
Figure 14B:
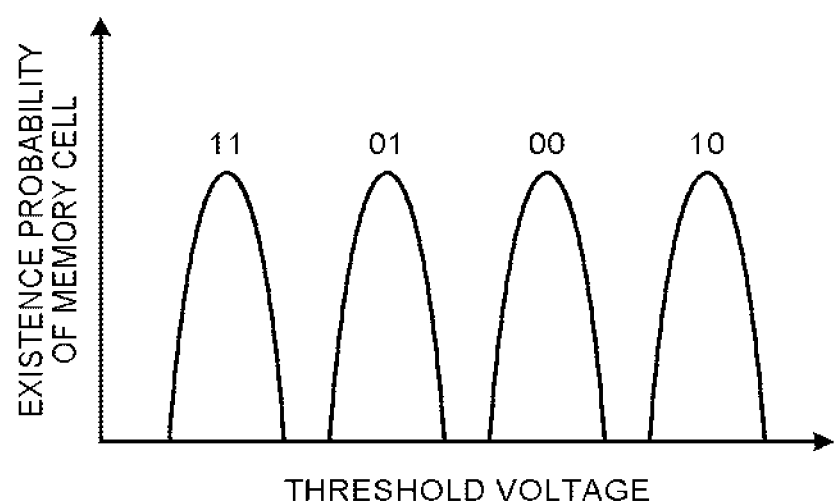
FIG. 14B is a diagram illustrating an example of the distribution shape of threshold voltages of an MLC.

FIG. 14A is a diagram illustrating an example of the distribution shape of threshold voltages of the SLC, and FIG. 14B is a diagram illustrating an example of the distribution shape of threshold voltages of the MLC. In FIGS. 14A and 14B, a horizontal axis represents a threshold voltage and a vertical axis represents the existence probability of the memory cell. In the case of the SLC, two distributions are included in a certain voltage range as illustrated in FIG. 14A. On the other hand, in the case of the MLC, four distributions are included in a certain voltage range as illustrated in FIG. 14B. For this reason, the width of each distribution in the case of the MLC is smaller than that in the case of the SLC. Further, the distribution shape is changed in a situation, such as a case in which data is written at a low temperature and is read out at a high temperature and a case in which data is written at a high temperature and is read out at a low temperature on the contrary to this. In this case, since the width of each distribution is small in the case of the MLC, the adjacent distributions trail therebetween.

In contrast, since the width of each distribution in the case of the SLC is larger than the width of each distribution in the case of the MLC, the degree of overlap between the adjacent distributions is suppressed in comparison with the case of the MLC even though the distribution shape is changed. That is, the deterioration of data is not easily caused in the case of the SLC by cross temperature in comparison with the case of the MLC.

Accordingly, in this embodiment, the control circuit 131 has a function to generate a command for instructing data to be written by using the memory cells in the SLC mode when the temperature of the memory cell array 110 at the time of the writing of data is in the rewriting temperature range. Further, the control circuit 131 generates a command for instructing data to be written by using the memory cells in the MLC mode when the temperature of the memory cell array 110 at the time of the writing of data is not a temperature in the rewriting temperature range. Meanwhile, since other structures are the same as those of the first embodiment, the description thereof will be omitted.

Figure 15:
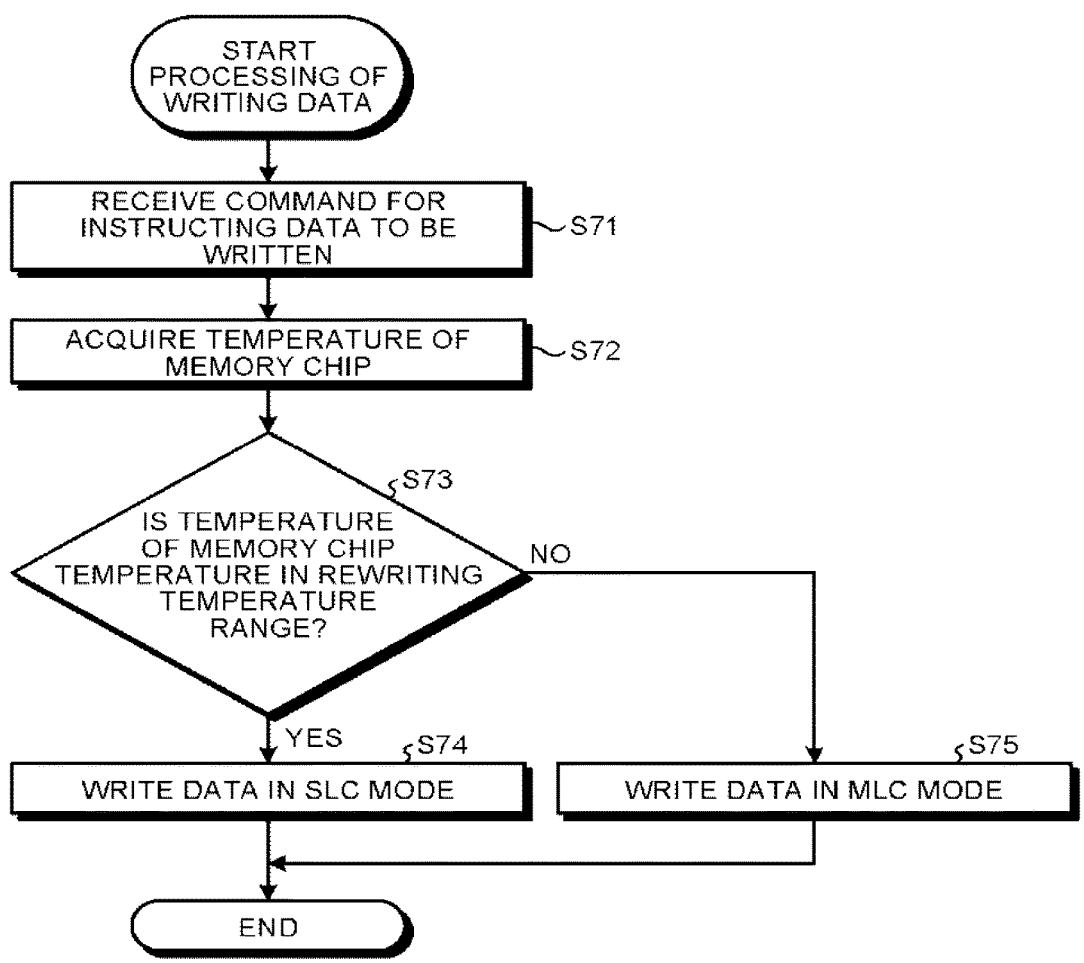
FIG. 15 is a flowchart illustrating an example of a procedure of processing for writing data according to a fifth embodiment.

FIG. 15 is a flowchart illustrating an example of a procedure of processing of writing data according to a fifth embodiment. First, when receiving a command for instructing data to be written (Step S71), the control circuit 131 acquires the temperature of the memory chip 100 from the temperature measurement circuit 120 (Step S72). Then, the control circuit 131 determines whether or not the temperature of the memory chip is a temperature in the rewriting temperature range (Step S73).

If the temperature of the memory chip is a temperature in the rewriting temperature range (Yes in Step S73), the control circuit 131 writes data, for which the command is received, in the SLC mode (Step S74) and the processing of writing data ends.

On the other hand, if the temperature of the memory chip is not a temperature in the rewriting temperature range (No in Step S73), the control circuit 131 writes data, for which the command is received, in the MLC mode (Step S75) and the processing of writing data ends. In Steps S74 and S75, temperature at the time of the writing of data is also written in the redundant portion 502 as described in the first embodiment.

Meanwhile, a case in which data in the SLC mode is written when the temperature of the memory chip at the time of the writing of data is a temperature in the rewriting temperature range has been described in the above description. However, the embodiment is not limited thereto. For example, the control circuit 131 may write a part of data in the SLC mode and may write other data in the MLC mode in a case in which the temperature of the memory cell array 110 at the time of the writing of data is a temperature in the rewriting temperature range. Important data can be exemplified as the part of data that is written in the SLC mode. Further, unimportant data or data, which does not cause a trouble even though being not read out later, can be exemplified as the other data written in the MLC mode. That is, the control circuit 131 does not write all data in the SLC mode and may write a part of data in the SLC mode.

Examples of the important data can include user data, address management information, and the like that are stored in the data body portion 501. Examples of the unimportant data can include data and the like that are stored in the redundant portion 502. The deterioration of data is suppressed by an increase in a ratio of data written in the SLC mode in a case in which the temperature of the memory cell array 110 at the time of the writing of data is in the rewriting temperature range as described above.

Meanwhile, the memory chip 100 has been described above. However, as in the second embodiment, the controller chip 220 of the memory device 200 of FIG. 7 may have a function to write data by using at least a part of the memory cells in the SLC mode in a case in which the temperature of the memory cell array 110 at the time of the writing of data is a temperature in the rewriting temperature range. Further, as in the third embodiment, the controller 320 of the information-processing device 300 of FIGS. 8 and 9 may have a function to write data by using at least a part of the memory cells in the SLC mode in a case in which the temperature of the memory cell array 110 at the time of the writing of data is a temperature in the rewriting temperature range.

Furthermore, a case in which the memory cell is formed of an MLC has been described in the above description, but the same processing can be performed even in a case in which the memory cell is formed of a memory cell capable of storing 3-or-more-bit data.

In the fifth embodiment, data is written by using at least a part of the memory cells in the SLC mode when the temperature of the memory cell array 110 at the time of the writing of data is in the rewriting temperature range in a case in which the memory cell can store 2-or-more-bit data. Accordingly, it is possible to reduce an influence of cross temperature at the time of the readout of data.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of controlling a memory system including a non-volatile memory and a temperature measurement circuit, the method comprising:
   when writing data into the non-volatile memory, writing information about a temperature of the non-volatile memory which is measured by the temperature measurement circuit into the non-volatile memory along with the data; and
   in a case that the temperature at which the data has been written into the non-volatile memory is in a rewriting temperature range, performing write-back processing while a temperature measured by the temperature measurement circuit is not in the rewriting temperature range, the write-back processing being processing in which the data is re-written into the non-volatile memory.

2. The method according to claim 1, wherein the performing write-back processing includes:
   reading out the data written at a temperature in the rewriting temperature range; and
   writing the read data into the non-volatile memory.

3. The method according to claim 2, wherein
   the data includes a data body portion and a redundant portion, and
   in the writing the information, the information about the temperature which is measured at the time of the writing of the data is stored in the redundant portion when writing the data body portion.

4. The method according to claim 1, wherein the write-back processing is performed when receiving a command to instruct the write-back processing to be performed.

5. The method according to claim 1, wherein the write-back processing is performed in case of receiving a command to instruct rewriting the data, or in a case in which the memory system enters a low-power mode without receiving a command.

6. The method according to claim 1, wherein when a command to instruct shutting power off is received, the write-back processing is performed by a time power is shut off after receiving the command.

7. The method according to claim 1, wherein
a writing condition is changed according to a temperature at which the data is written into the non-volatile memory, or
a readout condition is changed according to a temperature at which the data has been written into the non-volatile memory at a time of readout of the data from the non-volatile memory.

8. The method according to claim 7, wherein
the non-volatile memory includes a memory cell, and
the writing condition or the readout condition includes at least one of a voltage value and a pulse width of a pulse voltage applied to the memory cell.

9. The method according to claim 1, wherein
the non-volatile memory includes a memory cell, the memory cell being capable of storing data in a first mode where the memory cell is capable of storing only one-bit data or in a second mode where the memory cell is capable of storing plural-bit data, and
the writing information includes, when writing data in the non-volatile memory:
writing the data into the memory cell in the second mode in a case in which a temperature measured by the temperature measurement circuit is not in the rewriting temperature range, and
writing at least a part of the data into the memory cell in the first mode in a case in which a temperature measured by the temperature measurement circuit is in the rewriting temperature range.

10. The method according to claim 1, wherein
the non-volatile memory includes a memory cell array provided on a semiconductor substrate.

11. The method according to claim 1, wherein
the non-volatile memory is a memory chip that includes a memory cell array, a peripheral circuit, and the temperature measurement circuit, the memory cell array being provided on a semiconductor substrate, the peripheral circuit being provided on the semiconductor substrate and driving the memory cell array, the temperature measurement circuit measuring the temperature of the memory chip, and
the controller is a control circuit that is included in a controller chip controlling an operation of the memory chip.

12. A method of controlling a memory system including a non-volatile memory and a temperature measurement circuit, the non-volatile memory including a memory cell array, the memory cell array including a memory cell, the memory cell being capable of storing data in a first mode where the memory cell is capable of storing only one-bit data or in a second mode where the memory cell is capable of storing plural-bit data, the method comprising:
when writing data into the non-volatile memory:
writing the data into the memory cell in the second mode in a case in which a temperature measured by the temperature measurement circuit is not in a rewriting temperature range, and
writing at least a part of the data into the memory cell in the first mode in a case in which a temperature measured by the temperature measurement circuit is in the rewriting temperature range.

13. The method according to claim 12, wherein
the non-volatile memory includes the memory cell array provided on a semiconductor substrate.

14. The method according to claim 12, wherein
the non-volatile memory is a memory chip that includes the memory cell array, a peripheral circuit, and the temperature measurement circuit, the memory cell array being provided on a semiconductor substrate, the peripheral circuit being provided on the semiconductor substrate and driving the memory cell array, the temperature measurement circuit measuring the temperature of the memory chip.

15. A method of controlling an information-processing device including a memory device and a temperature measurement circuit, the memory device including a memory chip and a controller chip controlling an operation of the memory chip, the memory chip including a non-volatile memory cell array that is provided on a semiconductor substrate and a peripheral circuit that is provided on the semiconductor substrate and configured to drive the memory cell array, the method comprising:
when writing data into the memory cell array, writing information about a temperature of the memory chip which is measured by the temperature measurement circuit into the memory cell array along with the data; and
in a case that a temperature at which the data has been written into the memory cell array is in a rewriting temperature range, performing write-back processing while a temperature measured by the temperature measurement circuit is not in the rewriting temperature range, the write-back processing being processing in which the data is re-written into the memory cell array.

16. The method according to claim 15, wherein the performing write-back processing includes:
reading out the data written at a temperature in the rewriting temperature range; and
writing the read data into the memory cell array.

17. The method according to claim 16, wherein
the data includes a data body portion and a redundant portion, and
in the writing the information, the information about the temperature which is measured at the time of the writing of the data is stored in the redundant portion when writing the data body portion.

18. The method according to claim 15, wherein the write-back processing is performed when receiving a command to instruct the write-back processing to be performed.

19. The method according to claim 15, wherein the write-back processing is performed in case of receiving a command to instruct rewriting the data or in a case in which the memory device enters a low-power mode without receiving a command.

20. The method according to claim 15, wherein when a command to instruct shutting power off is received, the write-back processing is performed by a time power is shut off after receiving the command.

* * * * *